(12) United States Patent
Kim et al.

(10) Patent No.: US 11,705,483 B2
(45) Date of Patent: *Jul. 18, 2023

(54) CAPACITOR STRUCTURE AND SEMICONDUCTOR DEVICES HAVING THE SAME

(71) Applicant: SAMSUNG ELECTRONICS CO., LTD., Suwon-si (KR)

(72) Inventors: Eun-Sun Kim, Suwon-si (KR); Sang-Yeol Kang, Yongin-si (KR); Kyoo-Ho Jung, Seoul (KR); Kyu-Ho Cho, Seoul (KR); Hyo-Sik Mun, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 50 days.

This patent is subject to a terminal disclaimer.

(21) Appl. No.: 17/366,115

(22) Filed: Jul. 2, 2021

(65) Prior Publication Data

US 2021/0343832 A1 Nov. 4, 2021

Related U.S. Application Data

(62) Division of application No. 16/445,011, filed on Jun. 18, 2019, now Pat. No. 11,088,240.

(30) Foreign Application Priority Data

Oct. 17, 2018 (KR) ........................ 10-2018-0123588

(51) Int. Cl.
*H01L 27/108* (2006.01)
*H01G 4/10* (2006.01)
(Continued)

(52) U.S. Cl.
CPC ............. *H01L 28/75* (2013.01); *H01G 4/008* (2013.01); *H01G 4/10* (2013.01); *H10B 12/315* (2023.02)

(58) Field of Classification Search
CPC .......... H01G 4/008; H01G 4/10; H01G 4/005; H01G 4/018; H01G 4/1281; H01G 4/128;
(Continued)

(56) References Cited

U.S. PATENT DOCUMENTS

| 5,757,061 A | 5/1998 | Satoh et al. |
| 5,828,098 A | 10/1998 | Shimada et al. |

(Continued)

FOREIGN PATENT DOCUMENTS

| JP | 2638579 | 4/1997 |
| JP | 11054710 A | 2/1999 |

(Continued)

OTHER PUBLICATIONS

Pirrotta et al., "Leakage current through the poly-crystalline HFO2: Trap density at grain and grain boundaries", 2013, Journal of Applied Physics, vol. 114, pp. 134503-1-134503-5, Oct. 1, 2013 (Year: 2013).*

(Continued)

*Primary Examiner* — Nikolay K Yushin
(74) *Attorney, Agent, or Firm* — Volentine, Whitt & Francos, PLLC

(57) ABSTRACT

A capacitor includes a lower electrode including a first metal material and having a first crystal size in a range of a few nanometers, a dielectric layer covering the lower electrode and having a second crystal size that is a value of a crystal expansion ratio times the first crystal size and an upper electrode including a second metal material and covering the dielectric layer. The upper electrode has a third crystal size smaller than the second crystal size.

17 Claims, 10 Drawing Sheets

(51) Int. Cl.
*H01L 49/02* (2006.01)
*H01G 4/008* (2006.01)
*H10B 12/00* (2023.01)

(58) Field of Classification Search
CPC ............ H01L 27/10814; H01L 27/108; H01L 27/10805; H01L 27/10835; H01L 28/75; H01L 28/40; H01L 28/60; H01L 28/65; H01L 28/56; H10B 12/315; H10B 12/00; H10B 12/03
See application file for complete search history.

(56) References Cited

U.S. PATENT DOCUMENTS

| | | | |
|---|---|---|---|
| 6,060,735 | A | 5/2000 | Izuha et al. |
| 7,695,832 | B2 | 4/2010 | Oikawa |
| 3,361,860 | A1 | 1/2013 | Kim et al. |
| 8,481,106 | B2 | 7/2013 | Mukherjee et al. |
| 8,642,126 | B2 | 2/2014 | Noda |
| 8,980,647 | B2 | 3/2015 | Wang |
| 9,437,420 | B2* | 9/2016 | Cho .................. H01L 27/10894 |
| 11,121,139 | B2* | 9/2021 | Frank ...................... H01L 28/60 |
| 2006/0154436 | A1 | 7/2006 | Kim et al. |
| 2006/0269794 | A1 | 11/2006 | Oikawa |
| 2007/0231486 | A1 | 10/2007 | Noda |
| 2008/0220153 | A1 | 9/2008 | Mukherjee et al. |
| 2009/0224301 | A1 | 9/2009 | Yamakawa et al. |
| 2013/0149794 | A1 | 6/2013 | Wang |
| 2015/0357399 | A1* | 12/2015 | Cho .................. H01L 27/10894 257/532 |
| 2018/0315811 | A1 | 11/2018 | Cho et al. |
| 2019/0013391 | A1 | 1/2019 | Moon et al. |
| 2019/0148390 | A1* | 5/2019 | Frank .................. H01L 21/0228 257/295 |

FOREIGN PATENT DOCUMENTS

| | | |
|---|---|---|
| JP | 2002076290 A | 3/2002 |
| JP | 2009-212448 A | 9/2009 |
| KR | 1020060062365 A | 6/2006 |
| KR | 0716643 B1 | 5/2007 |
| KR | 0965771 | 6/2010 |
| KR | 1020110000290 A | 1/2011 |
| KR | 1060740 | 8/2011 |
| KR | 1020170118877 A | 10/2017 |
| KR | 20180120308 A | 11/2018 |

OTHER PUBLICATIONS

Song et al., "Size dependence of structural parameters in fcc and hcp Ru nanoparticles, revealed by Rietveld refinement analysis of high-energy X-ray diffraction data", 2016, Scientific Report, V. 6(1), 31600, pp. 1-7), Aug. 10, 2016 (Year: 2016).
Korean Office Action dated Mar. 24, 2023, Cited in Korean Patent Application No. 10-2018-0123588.

* cited by examiner

CAPACITOR STRUCTURE AND SEMICONDUCTOR DEVICES HAVING THE SAME

PRIORITY STATEMENT

This is a Divisional of U.S. application Ser. No. 16/445,011, filed Jun. 18, 2019, now U.S. Pat. No. 11,088,240 issued on Aug. 10, 2021, and a claim of priority under 35 U.S.C § 119 to Korean Patent Application No. 10-2018-0123588 filed on Oct. 17, 2018 in the Korean Intellectual Property Office, the disclosures of which are hereby incorporated by reference in their entireties.

BACKGROUND

1. Field

The inventive concept relates to capacitors and semiconductor devices having the same, and more particularly, to MIM (metal-insulator-metal) capacitors and semiconductor devices having the same. The inventive concept also relates to the manufacturing of capacitors and more particularly, to MIM (metal-insulator-metal) capacitors and semiconductor devices having the same.

2. Description of the Related Art

The physical and chemical properties of the polysilicon impose a lower limit on the electric resistance of upper and lower electrodes of a PIP (polysilicon-insulator-polysilicon) capacitor. In addition, when a bias voltage is applied to the PIP capacitor, a depletion region is generated in the polysilicon and the electrode voltage tends to vary according to the bias voltage. Thus, the capacitance of the PIP capacitor tends to vary according to the voltage variation of the upper and the lower electrodes.

For that reason, the MIM capacitor has been widely used in place of the PIP capacitor. The electrodes of the MIM capacitor are composed of conductive metals, not of polysilicon, and the dielectric layer is interposed between the upper and the lower metal electrodes.

The capacitor size needs to be reduced if the degree of integration required of today's semiconductor devices is to be attained. For example, the degree of integration of capacitors needs to be increased if DRAM devices are to be downsized. Likewise, the degree of integration of BEOL capacitors needs to be increased if analogue devices are to be downsized.

Therefore, the dielectric layer of a MIM capacitor should have a high dielectric constant for providing a high capacitance despite the MIM capacitor occupying a relatively small amount of area in a semiconductor device.

SUMMARY

According to an aspect of the inventive concept, there is provided a capacitor including a lower electrode comprising a first metal material and having a crystal size of a few nanometers, a dielectric layer comprising dielectric material covering the first metal material, and an upper electrode covering the dielectric layer. The dielectric material covering the first metal material has a crystal size that is the value of a crystal expansion ratio times the crystal size of the first metal material. The upper electrode comprises a second metal material and has a crystal size smaller than the crystal size of the dielectric material.

According to another aspect of the inventive concept, there provided a capacitor including a lower electrode comprising a layer of a metal material having a crystal size in a range of 3-10 nanometers, a dielectric covering the layer of metal material of the lower electrode and comprising a layer of dielectric material having a crystal size that is 5-20 times the crystal size of the first metal material, and an upper electrode covering the dielectric, the upper electrode comprising a layer of a metal material having a crystal size smaller than the crystal size of the layer of dielectric material.

According to another aspect of the inventive concept, there provided a capacitor (product) made by a process comprising the steps of forming a lower electrode, depositing dielectric material directly on a layer of metal material of the lower electrode and epitaxially growing the dielectric material to form a preliminary layer of the dielectric material having a crystal size substantially the same as that of the metal material of the lower electrode, and subsequently subjecting the preliminary layer of the dielectric material to a heat treatment that causes crystals of the preliminary layer of dielectric material to merge together in respective groups thereof and thereby form dielectric material having a crystal size that is a multiple of that of the metal material of the lower electrode. The capacitor formed by this process has a lower electrode comprising a layer of a metal material, a dielectric on the lower electrode and comprising a layer of dielectric material having a crystal size larger than that of the metal material of the lower electrode. The upper electrode disposed on the dielectric comprises a layer of metal material having a crystal size smaller than that of a layer of dielectric material of the dielectric.

BRIEF DESCRIPTION OF THE DRAWINGS

These and other features of the inventive concept will become more apparent by referring to examples thereof described with reference to the accompanying drawings of which.

DETAILED DESCRIPTION

Figure 1:
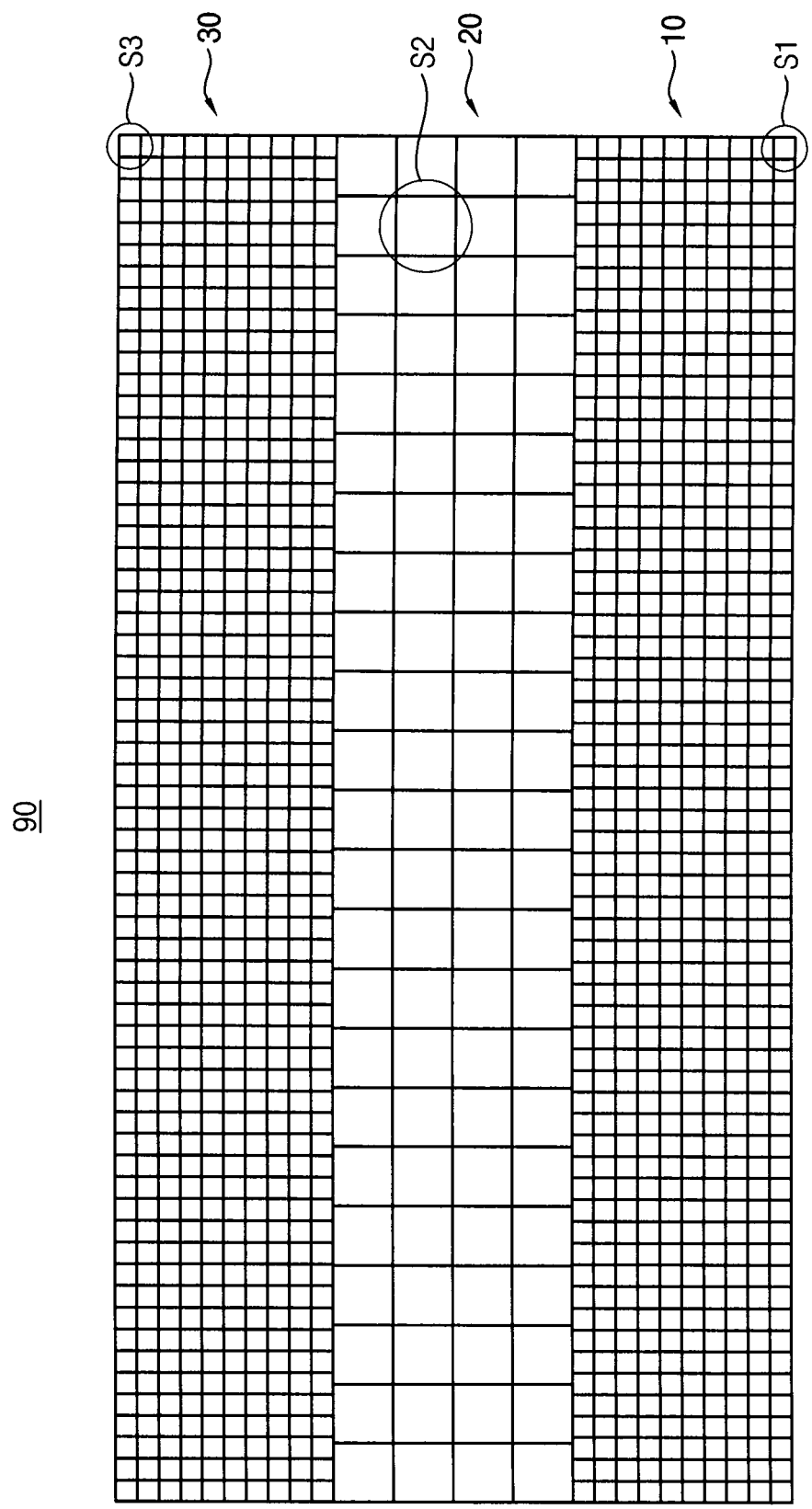
FIG. 1 is a schematic cross-sectional view of an example a capacitor in accordance with the present inventive concept.

The present inventive concept will now be explained with reference to the accompanying drawings. Like reference numerals may designate like components throughout the drawings.

FIG. 1 illustrates an example of a capacitor in accordance with the present inventive concept.

Referring to FIG. 1, a capacitor 90 in accordance with the present inventive concept may include a lower metal electrode 10 having a first crystal size S1 in a range of a few nanometers, a dielectric layer 20 having a second crystal size S2 larger than the first crystal size S1 by a crystal expansion ratio and an upper metal electrode 30 having a third crystal size S3 smaller than the second crystal size S2.

For example, the lower electrode 10 may comprise a first metal having a good conductivity and may have a crystal size in a range of a few nanometers. The crystal size of the lower metal electrode 10 may be referred to as first crystal size S1, so the first crystal size S1 may be in a range of a few nanometers. Examples of the first metal include titanium nitride (TiN), titanium aluminum nitride (TiAlN), tantalum nitride (TaN), tungsten nitride (WN), ruthenium (Ru), ruthenium oxide (RuO2), iridium (Ir), iridium oxide (IrO2), and niobium nitride (NbN). These may be used alone or in combinations thereof.

The first metal may be formed on a base plate (not shown) in minute crystals having a size of a few nanometers by a layer formation process for forming the lower electrode 10. A predetermined number of the minute crystals of the same size as those of the lower metal electrode 10 may be merged together into a single crystal of the dielectric layer 20, as will be described in detail hereinafter.

In the present example, one of a titanium nitride (TiN) layer and a niobium nitride (NbN) layer is formed on a base plate as the lower metal electrode 10 by a deposition process. In such a case, the process conditions of the deposition process may be controlled in such a way that the first crystal size S1 is in a range of about 3 nm to about 10 nm. The first crystal size S1 may be the radius or maximal width of a crystal with the assumption that the radii or maximal widths of all of the crystals for a particular metal material are substantially the same. Thus, in this example, the first crystal size S1 of the titanium nitride (TiN) layer or niobium nitride (NbN) layer is the radius or maximal width of a crystal the titanium nitride (TiN) or niobium nitride (NbN).

Other metal materials may be used for the lower metal electrode 10 as long as the crystal size of the metal material is smaller than that of titanium nitride (TiN) or niobium nitride (NbN).

The lower electrode 10 may have various forms depending on the characteristics of the capacitor 90. For example, the lower metal electrode 10 may have a 2-dimensional form such as a flat plate or a 3-dimensional form such as a cylinder or a pillar. Regarding the latter, the lower electrode 10 may basically have any 3-dimensional form as long as the form acts to increase the effective the surface area of the lower metal electrode 10. That is, the capacitance of the capacitor 90 depends on the effective surface area of the lower metal electrode 10, and thus the form of the lower metal electrode 10 may increase the capacitance with respect to a given footprint of the electrode.

The dielectric layer 20 is disposed on the lower electrode 10.

For example, the dielectric layer 20 may conform to a surface profile of the lower electrode 10. Thus, the dielectric layer 20 may make surface contact with the lower electrode 10 and the lower electrode 10 may be sufficiently covered by the dielectric layer 20. Therefore, when the lower electrode 10 has a 2-dimensional form, the dielectric layer 20 may have a 2-dimensional form conforming to the surface profile of the lower electrode 10. In the same way, when the lower electrode 10 has a 3-dimensional form, the dielectric layer 20 may have a 3-dimensional form conforming to the surface profile of the lower electrode 10.

Also, the dielectric constant of the dielectric layer 20 may be greater than that attributed to the dielectric material from which the dielectric layer 20 is formed. As will be described in detail hereinafter, the crystal size of the dielectric layer 20 may be larger than that of the lower electrode 10 and the dielectric constant of the dielectric layer 20 may become greater than that of the dielectric material comprising the dielectric layer 20 due to the size difference of crystals between the dielectric layer 20 and the lower electrode 10. The crystal size of the dielectric layer 20 may be refereed to as second crystal size S2, and thus the second crystal size S2 may be greater than the first crystal size S1.

The dielectric layer 20 may include at least any one dielectric material selected from the group consisting of zirconium oxide (ZrO2), hafnium oxide (HfO2), tantalum oxide (Ta2O3), aluminum oxide (Al2O3), aluminum nitride (AlN), boron nitride (BN), zirconium nitride (Zr3N4), hafnium nitride (Hf3N4), and a lanthanide. In addition, the dielectric layer 20 may consist of a single layer, i.e., may be a mono-layer, or may be a multilayered structure.

A ratio of the second crystal size S2 with respect to the first crystal size S1 may be referred to as crystal expansion ratio. Thus, the second crystal size S2 may be a value of the crystal expansion ratio times the first crystal size S1. Because providing a dielectric layer with a crystal size larger than that of the lower electrode is widely known to increase the dielectric constant of the dielectric layer 20, the overall capacitance of the capacitor 90 may be improved without changing the composition of the capacitor just by making the second crystal size S2 larger than the first crystal size S1.

In the present example, the crystal size of the dielectric layer 20 is a multiple of the first crystal size S1, i.e., the crystal expansion ratio is an integer.

A capacitor having a certain crystal expansion ratio may be attained according to the present inventive concept by tailoring the process conditions of a heat treatment for forming the dielectric layer 20 as will be described in detail hereinafter.

Growth of a preliminary dielectric layer 20a (see FIG. 3B) on the lower electrode 10 may be controlled by a unit of the crystal of the lower electrode 10 and thus the size of a crystal of the preliminary dielectric layer 20a (referred to as the preliminary crystal PC hereinafter) may be substantially the same as the first crystal size S1. Then, some of the preliminary crystals PC merge with one another as a result of the heat treatment for forming the dielectric layer 20, thereby forming a merged crystal MC on the lower electrode 10. The merged crystal MC may be a unit crystal of the dielectric layer 20.

In such a case, the number of preliminary crystals PC which merge into a single merged crystal MC determines the crystal expansion ratio. Thus, the size of the merged crystal MC may be the value of the crystal expansion ratio times the size of the preliminary crystal PC. Because the preliminary crystal PC may have substantially the same size as the unit crystal of the lower electrode 10 and the merged crystal MC may be provided as a unit crystal of the dielectric layer 20, the second crystal size S2 may be a multiple of the first crystal size S1.

According to an aspect of the inventive concept, in this example the crystal expansion ratio is preferably in a range of 5 to 20. Thus, in the present example 5 to 20 preliminary crystals PC have merged to form a single merged crystal MC, so the second crystal size S2 is 5 to 20 times the first crystal size S1. For example, when the first crystal size S1 of the lower electrode 10 is in a range of about 3 nm to about 10 nm, the second crystal size S2 of the dielectric layer 20 is in a range of about 15 nm to about 200 nm.

If the crystal expansion ratio were less than 5, the difference between the first and the second crystal size S1 and S2 would be so small that the change of the dielectric constant would be negligible and as a result, the overall capacitance of the capacitor 90 would be substantially unchanged. In contrast, if the crystal expansion ratio were more than 20, the size of the merged crystal MC would be so large that excessive leakage current would be likely to occur in the dielectric layer 20.

The upper electrode 30 is arranged on the dielectric layer 20. The upper electrode 30 may be in the form of a flat plate regardless of the form of the dielectric layer 20.

The upper electrode 30 may comprise a second metal having a good conductivity and may have the third crystal size S3 smaller than the second crystal size S2. The second metal may be substantially the same as the first metal or may be different from the first metal.

Examples of the second metal include titanium nitride (TiN), titanium aluminum nitride (TiAlN), tantalum nitride (TaN), tungsten nitride (WN), ruthenium (Ru), ruthenium oxide (RuO2), iridium (Ir), iridium oxide (IrO2), and niobium nitride (NbN). These may be used alone or in combinations thereof.

The second metal may be formed into a minute crystalline structure whose crystals have a size in a range of a few nanometers by a layer formation process similar to that used to form the first metal of the lower electrode 10. Thus, the third crystal size S3 may be smaller than the second crystal size S2 and the dielectric layer 20 interposed between the lower and the upper electrodes 10 and 30 may have the largest crystal size.

In the present example, the upper electrode 30 is of the same metal material as the lower electrode 10. Therefore, the crystal size of the upper electrode 30 is substantially the same as that of the lower electrode 10. However, the upper electrode 30 may have various other crystal sizes as long as the crystal size of the upper electrode 30 is smaller than that of the dielectric layer 20.

Although not shown in figures, a protection layer and a metal silicide layer may be interposed between the dielectric layer 20 and the upper electrode 30. The protection layer can prevent the oxygen atoms of the dielectric layer 20 from diffusing upwards into the upper electrode 30, thereby minimizing the leakage current through the dielectric layer 20. The metal silicide layer may be composed of silicides of metal of the upper electrode 30 and may reduce the electric resistance of the upper electrode 30.

According to the present example of the capacitor 90, the crystal size of the dielectric layer 20 is greater, by an amount corresponding to the crystal expansion ratio, than the crystal size of the lower electrode 10. It is generally known that the larger the difference in size of crystals between the lower electrode and the dielectric layer the greater is the dielectric constant of the dielectric layer in a MIM capacitor. Thus, the size increase of the crystals of the dielectric layer 20 with respect to the lower electrode may sufficiently increase the dielectric constant of the dielectric layer, and as a result, may increase the capacitance of the capacitor 90.

The crystal size of the dielectric layer 20 may become greater as the crystal size of the lower electrode 10 may be reduced. Thus, the lower electrode may comprise such a metal material that the crystal size of the lower electrode 10 may be minimized as much as possible in the process of forming the lower electrode 10.

Accordingly, the capacitance of the capacitor 90 may be simply improved according to the present inventive concept. That is, the capacitor 90 according to the present inventive concept may be greater, i.e., "improved" over that of a conventional capacitor whose upper and lower electrodes and dielectric layer are of the same materials as those of the capacitor 90.

Figure 2:
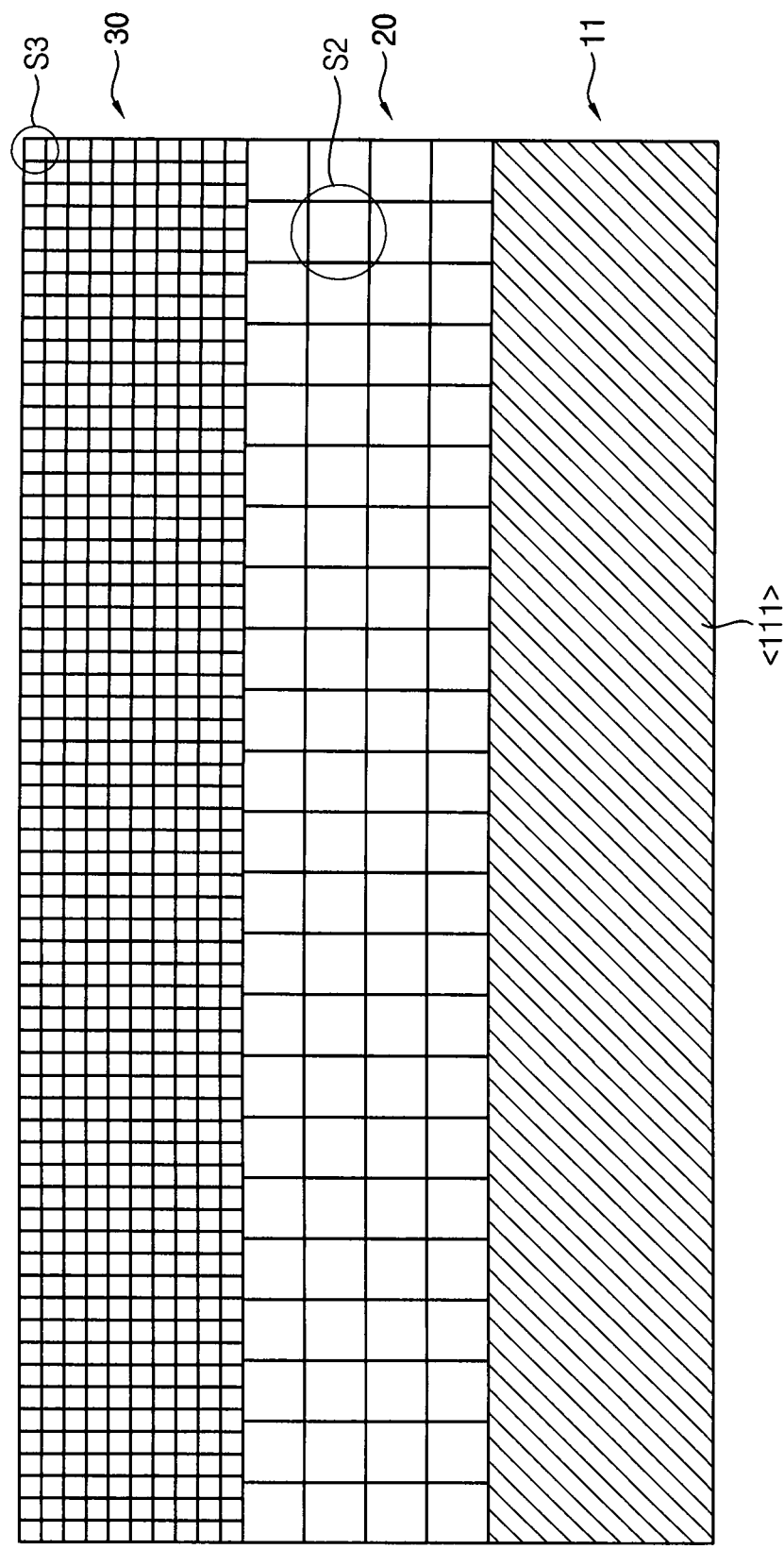
FIG. 2 is a schematic cross-sectional view of another example of a capacitor in accordance with the present inventive concept.

FIG. 2 illustrates another example of a capacitor in accordance with the present inventive concept. In the example of FIG. 2, the capacitor 91 has substantially the same structure as the capacitor 90 except for the lower electrode.

Referring to FIG. 2, the capacitor 91 includes a deformed lower electrode 11 in which the crystal or crystallographic direction may be in the family of symmetrically related directions <111> which will be referred to hereinafter simply as the <111> crystallographic direction. (Note, also, in the disclosure that follows other families of symmetrically related crystal or crystallographic directions as indicated by the conventional notation <h,k,l> will also be referred to simply as a direction or more particularly as a crystallographic direction.)

The response characteristics of silicon (Si) is known to be much more active in the <111> direction than in the <100> direction, and thus each unit crystal in the <111> direction of the deformed lower electrode 11 may function as a seed for forming the preliminary dielectric layer 20a. The preliminary dielectric layer 20a may be firstly formed on the deformed lower electrode 11 by a layer formation process and the preliminary layer 20a may be transformed into the dielectric layer 20 by heat treatment. In particular, the preliminary dielectric layer 20a may be grown from each unit crystal of the deformed lower electrode 11 in the <111> direction, so each preliminary crystal PC of the preliminary dielectric layer 20a may have substantially the same crystal size as the unit crystal of the deformed lower electrode 11.

Because the size of the unit crystal in the <111> direction may be substantially a minimal crystal size of the deformed lower electrode 11, the preliminary dielectric layer 20a may also have the crystal size corresponding to the minimal crystal size of the deformed lower electrode 11. That is, when a crystal of the deformed lower electrode 11 has the first crystal size S1 in the <111> direction, the preliminary crystal PC of the preliminary dielectric layer 20a may also have the first crystal size S1.

Subsequently, the preliminary dielectric layer 20a is heat treated for forming dielectric layer 20 on the deformed lower electrode 11. In such a case, a group of the preliminary crystals PC may easily merge or combine into a single merged crystal MC. In particular, a number of the preliminary crystals PC corresponding to the crystal expansion ratio merge to form a merged crystal MC and the merged crystal MC may function as a unit crystal structure of the dielectric layer 20. Thus, the crystal size of the dielectric layer 20 may be the value of the crystal expansion ratio times the preliminary crystal PC of the preliminary dielectric layer 20a. Accordingly, the second crystal size S2 may be the value of the crystal expansion ratio times the first crystal size S1.

Thus, when the deformed lower electrode 11 has the <111> crystallographic direction, the preliminary dielectric layer 20a may have the minimized crystal size corresponding to the size of the unit crystal of the deformed lower electrode 11 and a group of the preliminary crystals PC may easily merge into a merged crystal MC regardless of the materials of the deformed lower electrode 11. The preliminary dielectric layer 20a may be formed to have the minute crystal structure just by changing the crystallographic direction of the lower electrode to the <111> direction and a group of the minute crystals may merge into a merged crystal MC. The merged crystal MC may be provided as a unit crystal of the dielectric layer 20 and the size difference between the dielectric layer 20 and the deformed lower electrode 11 may produce a greater dielectric constant. Accordingly, the capacitance of the capacitor 91 may be simply improved just by increasing the crystal size of the dielectric layer 20 with respect to that of the deformed lower electrode 11 without any material changes.

FIGS. 3A to 3E are illustrate process of an example of a method of forming the capacitor shown in FIG. 1.

Figure 3A:
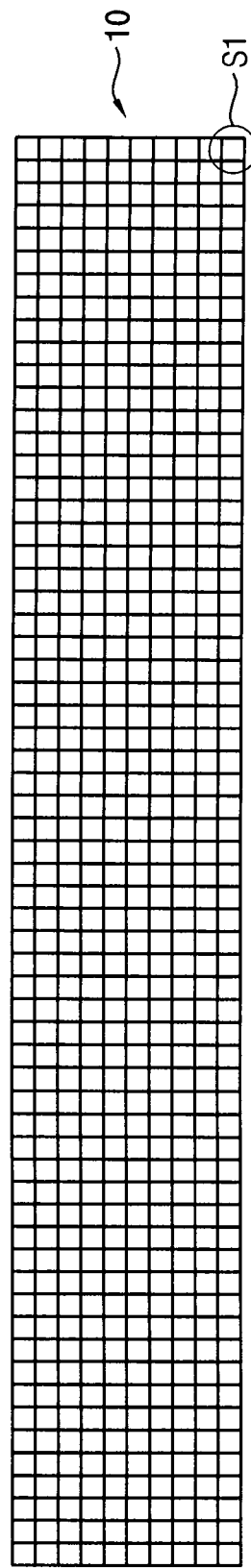
FIGS. 3A, 3B, 3C, 3D and 3E are cross-sectional view of the capacitor shown in FIG. 1 during the course of its manufacture and together illustrate a method of manufacturing a capacitor in accordance with the present inventive concept.

Referring to FIG. 3A, the lower electrode 10 comprising first conductive metal material may be formed on the base plate (not shown) by a deposition process.

For example, the first conductive metal material may be deposited onto capacitor areas of the base plate by a deposition process such as a physical vapor deposition (PVD) process, a chemical vapor deposition (CVD) process or an atomic layer deposition (ALD) process.

The first conductive metal material selected for deposition may be such a metal material that the crystal size of the lower electrode 10 is minimal, i.e., is relatively small. Examples of the first conductive metal material include titanium nitride (TiN), titanium aluminum nitride (TiAlN), tantalum nitride (TaN), tungsten nitride (WN), ruthenium (Ru), ruthenium oxide (RuO2), iridium (Ir), iridium oxide (IrO2), and niobium nitride (NbN) alone or in a combination of at least two thereof. In the present example, the lower electrode 10 is formed of either titanium nitride (TiN) or niobium nitride (NbN).

When the first conductive metal material is deposited onto a silicon substrate, the deposition process may be controlled in such a way that the crystal size of the lower electrode 10, that is the first crystal size S1, is in a range of about 3 nm to about 10 nm, for example.

Figure 3B:
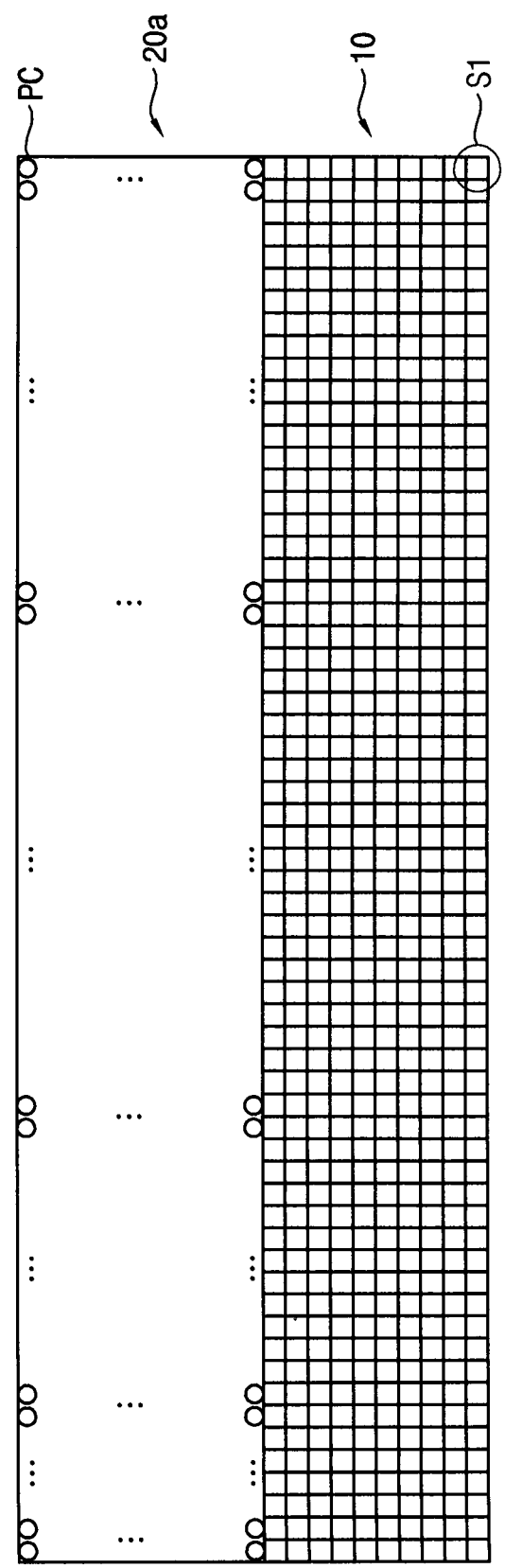

Referring to FIG. 3B, a preliminary dielectric layer 20a may be formed on the lower electrode 10.

For example, dielectric material may be deposited onto the lower electrode 10 by a low-temperature CVD (epitaxial growth) process, thereby forming the preliminary dielectric layer 20a on the lower electrode 10. In particular, the preliminary dielectric layer 20a may be conformally formed on the lower electrode 10 so that the lower electrode 10 is sufficiently covered by the preliminary dielectric layer 20a.

Examples of the dielectric materials include zirconium oxide (ZrO2), hafnium oxide (HfO2), tantalum oxide (Ta2O3), aluminum oxide (Al2O3), aluminum nitride (AlN), boron nitride (BN), zirconium nitride (Zr3N4), hafnium nitride (Hf3N4), and a lanthanide. These may be used alone or in combinations thereof.

The preliminary dielectric layer 20a may be formed in such a way that each crystal of the preliminary dielectric layer 20a may be grown by a unit of the crystal structure of the lower electrode 10. Thus, the crystal size of the preliminary crystal PC of the preliminary dielectric layer 20a may be similar to the crystal size of the lower electrode 10.

As a result, a plurality of the preliminary crystals PC may be sequentially stacked on and over each crystal of the lower electrode 10, so a crystal chain may be arranged on each crystal of the lower electrode 10.

When the preliminary crystals PC are respectively grown on the crystals at the top of the lower electrode 10, the strain energy between the neighboring preliminary crystals PC may be minimized in the preliminary dielectric layer 20a.

Figure 3C:
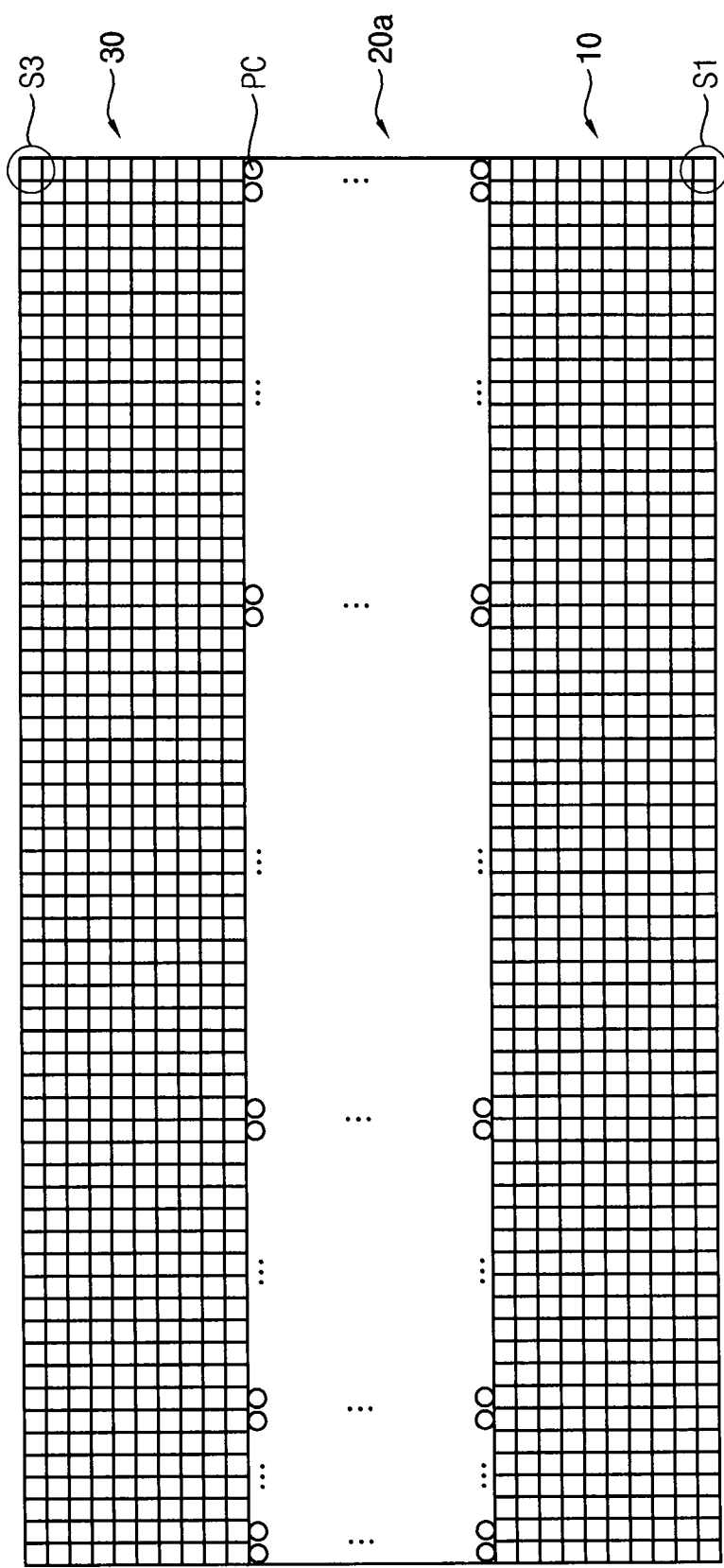

Referring to FIG. 3C, the upper electrode may be formed on the preliminary dielectric layer 20a.

For example, the second conductive metal material may be deposited on the preliminary dielectric layer 20a by a deposition process, thereby forming the upper electrode 30. In such a case, the upper electrode 30 may be formed as a flat plate regardless of the form of the preliminary dielectric layer 20a.

In the present example, the second conductive metal material is substantially the same material as the first conductive metal material. Examples of the second conductive metal material thus include titanium nitride (TiN), titanium aluminum nitride (TiAlN), tantalum nitride (TaN), tungsten nitride (WN), ruthenium (Ru), ruthenium oxide (RuO2), iridium (Ir), iridium oxide (IrO2), and niobium nitride (NbN). These may be used alone or in combinations thereof.

In the present example, the upper electrode 30 may be formed by the same deposition process as the lower electrode 10, so that the crystal size of the upper electrode 30 may be substantially the same as the crystal size of the lower electrode 10. That is, the third crystal size S3 may be substantially the same as the first crystal size S1. Accordingly, the lower electrode 10, the preliminary dielectric layer 20a and the third electrode 30 may have substantially the same crystal size and may be sequentially stacked on the base plate.

In a different version of this example, process conditions of the deposition process for forming the upper electrode 30 are controlled so that the third crystal size S3 is greater than the first crystal size S1 but not greater than the second crystal size S2. That is, the first and the third crystal sizes S1 and S3 may be smaller than the second crystal size S2.

Figure 3D:
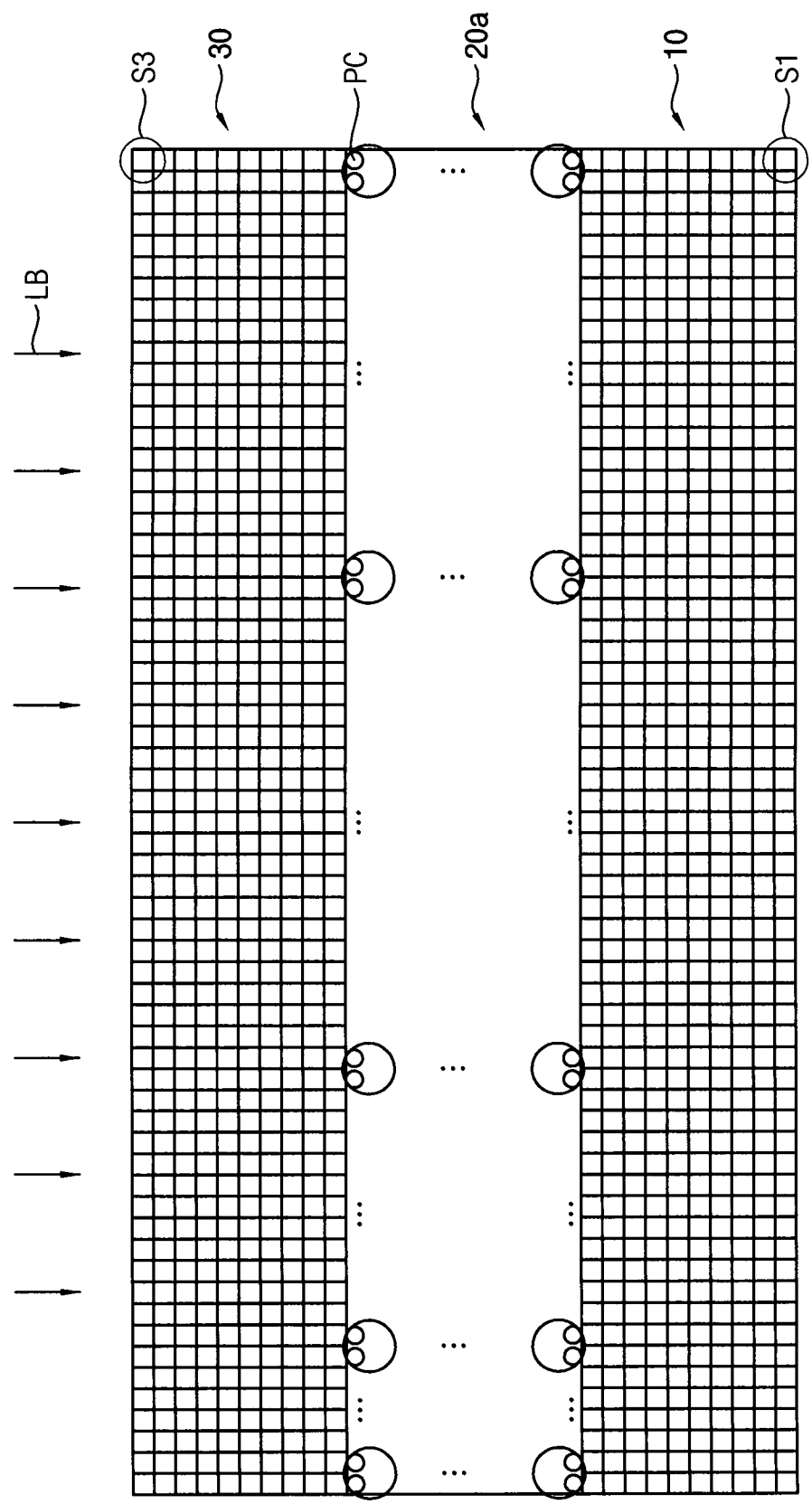

Referring to FIG. 3D, a stack structure of the lower electrode 10, the preliminary dielectric layer 20a and the upper electrode 30 are heated, i.e., are subjected to a heat treatment, to convert the preliminary dielectric layer 20a into the dielectric layer 20.

For example, the entire upper surface of the upper electrode 30a may be irradiated with a laser beam LB. The wavelength and the power of the laser beam LB may be controlled in such a way that the laser beam LB may just reach the preliminary dielectric layer 20a.

The preliminary crystals PC having the first crystal size S1 may be annealed by the heat treatment and as a result, merged to form a merged crystal MC. The merged crystal MC may function as a unit crystal structure of the dielectric layer 20. Thus, the size of the merged crystal MC may be identical to the second crystal size S2.

A group of the preliminary crystals PC may be merged into the merged crystal MC by the heat treatment and the merged number of the preliminary crystals PC may be determined by the crystal expansion ratio. Thus, the second crystal size S2 may be the crystal expansion ratio times the first crystal size S1.

More specifically, the merged number of preliminary crystals PC or the crystal expansion ratio may be determined by the process conditions of the heat treatment. For example, the focal point of the laser beam LB may be controlled by adjusting the wavelength and the laser power, and the preliminary crystals PC at the focal point may merge together into a merged crystal MC. In the present example, the focal point of the laser beam LB is a spot over which the laser beam is focused in a plane containing preliminary crystals PC. Therefore the merged number of the preliminary crystals PC or the crystal expansion ratio may be determined by the size (area) of the spot at which the laser beam LB is focused and the size (area) of the spot may be determined by the wavelength and the laser power of the laser beam LB. Accordingly, the crystal expansion ratio may be determined by the wavelength and the laser power of the laser beam LB.

The preliminary crystals PC in the focal point may merge together into a merged crystal MC in such a way that the surface energy of the preliminary crystals PC may be minimized. Thus, the optical system including the laser for emitting the laser beam may be configured such that the laser beam LB is focused onto a spot having a maximal area so that as many preliminary crystals PC as possible may merge under the minimal surface energy. Also, the optical system may scan the preliminary dielectric layer with the laser beam LB such that the spot of the focal point of the laser beam BM is moved to different areas across the preliminary dielectric layer. Therefore, the areas in which the preliminary crystals PC merge together into a merged crystal MC may be determined by the process conditions of the heat treatment and the distribution of the surface energy of the dielectric material.

In the present example, the preliminary crystals PC of a group in a "merge area" (area of the focused spot of the laser beam) merge together into a single merged crystal MC by a laser annealing process and the crystal size of the merged crystal MC is the value of the crystal expansion ratio times the crystal size of a preliminary crystal PC in the merge area.

For example, the crystal size of the merged crystal MC may be a multiple of the crystal size of the preliminary crystal PC, so the second crystal size S2 of the dielectric layer 20 may be the merged number times the crystal size of the preliminary layer 20a. The crystal size of the preliminary layer 20a may be substantially the same as the first crystal size S1 and the crystal size of the merged crystal MC may be substantially the same as the second crystal size S2. Therefore, the second crystal size S2 of the dielectric layer 20 may be represented by the following equation (1).

$$S2=S1*R \quad (1)$$
(wherein R denotes the merged number or the value of the crystal expansion ratio).

That is, the second crystal size S2 may be the crystal expansion ratio times the first crystal size S1. The crystal expansion ratio may indicate the ratio of the second crystal size S2 with respect to the first crystal size S1, and the dielectric layer 20 may be formed in such a way that the crystal structure of the dielectric layer 20 may be the crystal expansion ratio times the first crystal size S1.

As is generally accepted, the larger the difference between the crystal size of the dielectric layer and that of the lower electrode in a conventional MIM capacitor the greater is the capacitance of the MIM capacitor. Thus, the larger the crystal expansion ratio, the larger is the capacitance of the capacitor 90. According to an aspect of the inventive concept, the overall capacitance of a capacitor 90 may be significantly greater than that of a conventional (MIM) capacitor without resorting to selection of different materials for the components of the capacitor.

Because the crystal expansion ratio R or the merged number of the preliminary crystal PC may be changed by the heat treatment, the capacitance of the capacitor 90 may increase just by controlling the process conditions of the heat treatment without any changes of the capacitor compositions.

In the present example, the crystal expansion ratio R may be in a range of 5 to 20. That is, the merged crystal MC of the dielectric layer 20 may include 5 to 20 preliminary crystals PC of the preliminary dielectric layer 20, and the crystal size of the dielectric layer 20 may be 5 to 20 times the crystal size of the preliminary dielectric layer 20a. That is, the second crystal size S2 may be 5 to 20 times the first crystal size S1.

For example, when the lower electrode 10 has a crystal size in a range of about 3 nm to about 10 nm, the dielectric layer 20 has a crystal size in a range of 15 nm to 200 nm. Accordingly, the capacitance of the capacitor 90 may be significantly increased just by increasing the size of the crystals of the dielectric layer 20 with respect to those of the lower electrode 10.

Although the heat treatment of the present example has been described as a laser annealing process, other thermal processes may also be used to heat treat the preliminary dielectric layer 20a as long as those processes can effectively cause the crystals of the preliminary dielectric layer 20a to merge for forming the dielectric layer 20. For example, a thermal oxidation process may also be used as the heat treatment of the preliminary dielectric layer 20a for causing the preliminary crystals PC of respective groups thereof to merge together into single merged crystals MC, respectively.

Figure 3E:
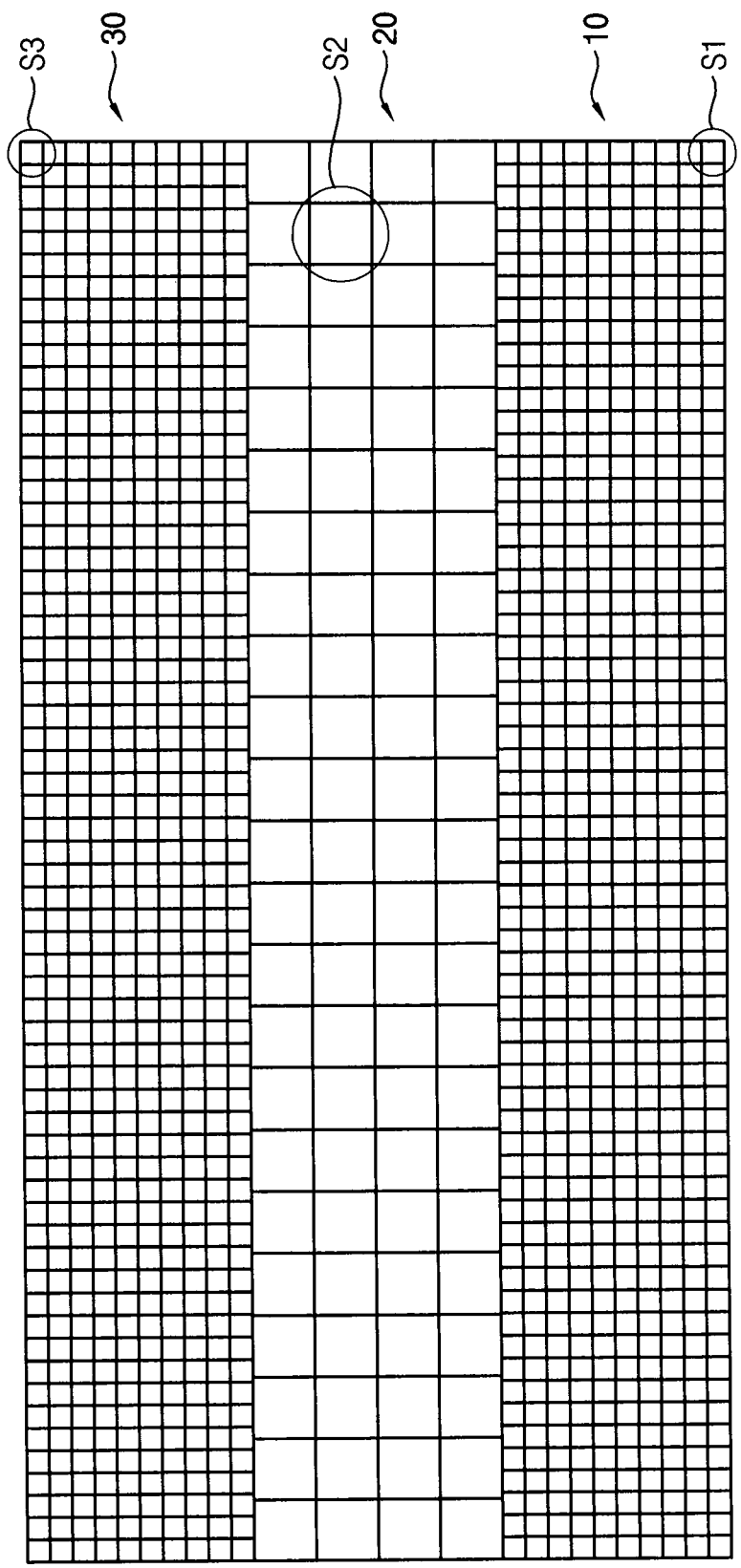

Referring to FIG. 3E, when the heat treatment is completed, the dielectric layer 20 comprising a plurality of merged crystals MC is interposed between the lower and the upper electrodes 10 and 30.

The heat treatment may be conducted in such a way that the lower and the upper electrodes 10 and 30 are not influenced by the heat treatment and the crystal sizes of the lower and the upper electrodes 10 and 30 are substantially unchanged by the heat treatment. Thus, the capacitance of the capacitor 90 may be easily and simply improved by the crystal expansion ratio R that may be determined by material properties of the dielectric materials and process conditions of the heat treatment.

According to the above-described example of a method of forming capacitors, the lower electrode 10 having a minimized crystal size may be formed on a base plate and the preliminary dielectric layer 20a having the same crystal size as the lower electrode 10 may be formed on the lower electrode 10 Then, groups of the preliminary crystals PC of the preliminary dielectric layer 20a may be merged into merged crystals MC, respectively, by a heat treatment process, thereby forming the dielectric layer 20 having the merged crystals as unit crystal structures. Thus, the crystal size of the dielectric layer 20 may be greater than that of the lower electrode 10. The larger crystal size of the dielectric layer 20 may sufficiently increase the dielectric constant of the dielectric layer 20 without any material changes, thereby simply and easily improving the capacitance of the capacitor.

In another method of manufacturing a capacitor according to the inventive concept, the process conditions for depositing the first conductive metal material on the base plate may be controlled in such a way that the crystallographic direction of the resulting lower electrode 10 may be the <111> direction, thereby forming the deformed lower electrode 11 shown in FIG. 2 on the base plate.

Subsequently, the same processes as described in detail with references to FIGS. 3B to 3E may be sequentially conducted and the capacitor 91 shown in FIG. 2 may be formed on the base plate.

According to this example of a method of forming capacitors, the lower electrode 10 is formed such that its crystallographic direction is the <111> direction. Accordingly, the crystal size of the preliminary dielectric layer 20a may be sufficiently reduced into the minute crystal structure without any reduction of the crystal size of the lower electrode 10. Thus, groups of the preliminary crystals PC of the preliminary dielectric layer 20a may be merged into merged crystals MC, respectively, by a heat treatment process and the crystal size of the dielectric layer 20 may become larger than that of the lower electrode 10 even the lower electrode 10 is not formed to have the minute crystal structure.

Figure 4:
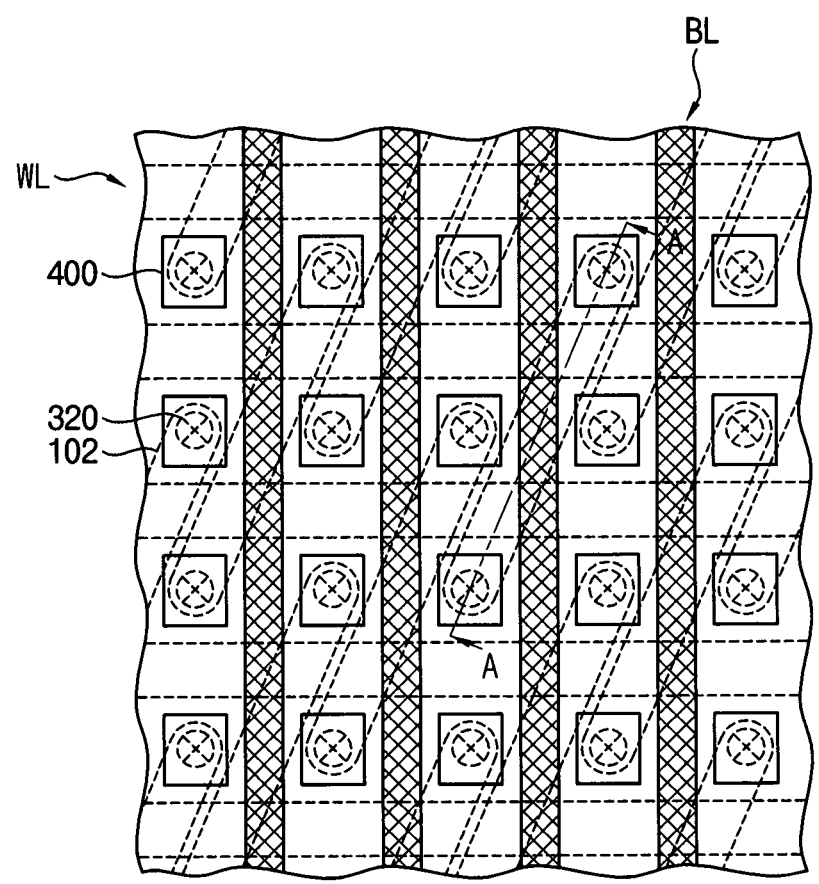
FIG. 4 is a plan view of an example of a semiconductor device having a capacitor in accordance with the present inventive concept.
Figure 5:
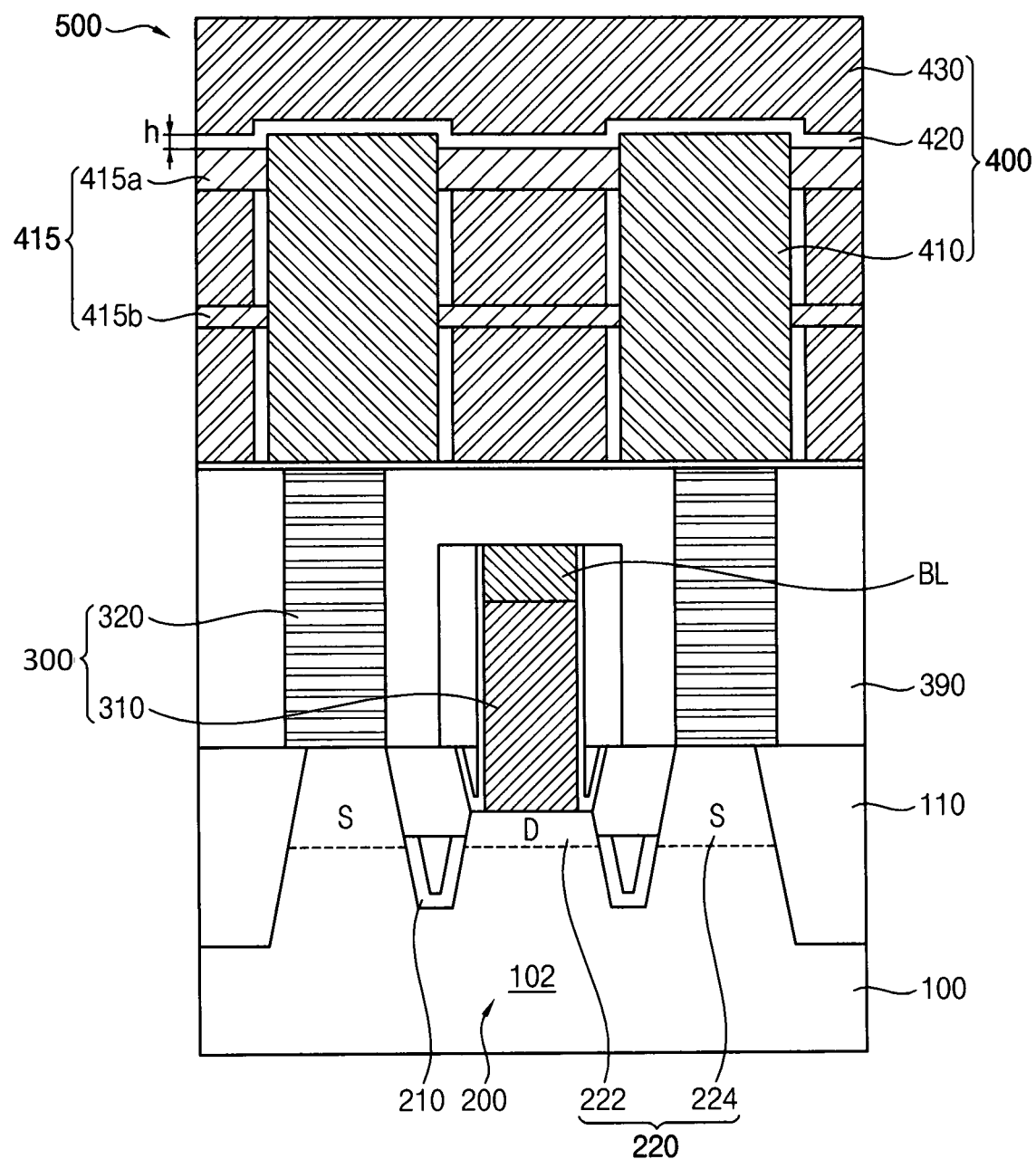
FIG. 5 is a cross-sectional view taken along line A-A' of FIG. 4.

FIGS. 4 and 5 illustrate an example of a semiconductor device having capacitors in accordance with the present inventive concept. In FIGS. 4 and 5, the semiconductor device is exemplified as a DRAM device having a BCAT structure and a MIM capacitor. However, the present inventive concept may also be applied to any other type of semiconductor device having a MIM capacitor as a data storing unit.

Referring to FIGS. 4 and 5, the example of a semiconductor device 500 in accordance with the present inventive concept includes a substrate 100, a plurality of memory cell structures 200 arranged on the substrate 100 and electrically connected to surroundings through a contact structure 300 and a capacitor 400 connected to the memory cell structure 200 and selectively storing electric charges.

The capacitor 400 includes a metallic lower electrode 410 connected with the contact structure 300 and having a first crystal size S1 in a range of a few nanometers, a dielectric layer 420 covering the lower electrode 410 and having a second crystal size S2 that is a crystal expansion ratio times the first crystal size S1 and a metallic upper electrode 430 arranged on the dielectric layer 420 and having a third crystal size S3 smaller than the second crystal size S2. In the present example, the lower electrode 410 may be supported by at least a support 415.

The substrate 100 may comprise a semiconductor substrate or a glass substrate on which a plurality of thin film transistor (TFT) are arranged. Examples of the semiconductor substrate include a silicon (Si) substrate, a germanium (Ge) substrate, a silicon-on-insulator (SOI) substrate and a germanium-on-insulator (GOI) substrate.

The substrate 100 may be divided into at least an active region 102 on which conductive structures such as gate electrodes are arranged and at least a field region defining the active region 102. A device isolation layer 110 may be arranged on the field region and the conductive structures on the neighboring active regions 102 may be electrically isolated from one another by the device isolation layer 110.

In the present example, the active region 102 extends at a predetermined angle obliquely with respect to a first direction I or a second direction II and a plurality of the active regions 102 may be spaced at the uniform intervals in the first direction I and the second direction II. This arrangement of the active regions 102 may provide a sufficiently high cell density on the substrate 100 together with the sufficient gaps between the neighboring active regions 102.

A pair of gate lines may extend in the first direction I and may cross a single active region 102 and a single conductive line may extend in the second direction II and may cross a central portion of the active region 102. The gate line extending in the first direction I may function as a word line WL of the semiconductor device 500 and the conductive line extending in the second direction II may function as a bit line BL of the semiconductor device 500. Thus, a pair of the word lines WL and a single bit line BL may extend longitudinally across at a single active region 102 in a cell area C of the substrate 100.

A memory cell structure 200 may be arranged on the cell area C of the substrate. 100. The memory cell structure 200 may include a buried gate 210 positioned buried in the substrate 100 under a top surfaced of the substrate 100 and a junction area 220 positioned above a top surface of the buried gate 210. Thus, the memory cell structure 200 may include a buried channel array transistor (BCAT).

A trench (not shown) may extend on the substrate 100 in the first direction I and may alternately cross active regions 102 and sections of the device isolation layer 110. The buried gate 210 may extend along the first direction I in the trench as the word line WL of the semiconductor device 500.

The buried gate 210 includes, for example, a gate insulation layer arranged on bottom and sides of the trench, a gate conductive pattern arranged on the gate insulation layer and filling a lower portion of the trench and a gate capping pattern arranged on the gate conductive pattern and filling an upper portion of the trench.

The active region 102 may be separated into parts by the buried gate 210 and impurities may be doped into the parts by an ion implantation process, thereby forming the junction area 220 at surface portions of the parts of the active region 102. In the case in which a pair of the word lines WL crosses a single active region 102, the active region 102 is separated into three separated portions: a central portion and end portions on opposite sides of the central portion. Thus, the junction area 220 may include a first junction 222 arranged at the central portion of the active region 102 and a pair of second junctions 224 arranged at the end portions of the active region 102.

The impurities may be implanted onto the separated parts of the active region 102 adjacent to the buried gate 210 and the junction areas 220 may be provided as source electrodes S and drain electrodes D.

The first junction 222 may be recessed from the top surface of the substrate 100 such that a top surface of the first junction 222 is disposed at a level lower than that of a top surface of the device isolation layer 110 and may contact a bit line contact 310 connected to the bit line BL.

A top surfaced of the second junction 224 may be coplanar with the top surface of the device isolation layer 110 and may be disposed at a level higher than that of the top surface of the first junction 222. The second junction 224 may contact a storage contact 320 connected to the capacitor 400.

The contact structure 300 may include the bit line contact 310 and the storage contact 320. The bit line contact 310 may be provided as a direct contact DC that contacts the bit line BL and the storage contact 320 may include a buried contact BC that contacts the capacitor 400 and is buried by an insulation interlayer 390.

The bit line BL may extend on the substrate 100 in the second direction II and a plurality of the bit lines BL may be spaced from each other in the first direction I by uniform intervals. Thus, each bit line BL may be simultaneously connected to a plurality of first junctions 222 in the second direction II and each second junction 224 may be interposed between the neighboring bit lines BL in the first direction I.

In the present example, the bit line BL is provided as a gate bit line GBL situated at the same level as a peripheral gate structure of the semiconductor device 500 and transfer bit line signals to the drain electrode D of the BCAT in the substrate 100.

The storage contact 320 is connected to the capacitor 400 and the second junction 224. A plurality of the storage contacts 320 may be arranged on each second junction 224 between the bit lines BL in a matrix shape in the first and second directions I and II.

A plurality of the storage contacts 320 may be electrically isolated from one another by the insulation interlayer 390 and the capacitor 400 may be arranged on the insulation interlayer 390. The storage contact 320 may extend through the insulation interlayer 390 and may reach the second junction 224. A landing pad (not shown) may be arranged between the storage contact 320 and the capacitor 400 for enlarging the contact area of the storage contact 320 and the capacitor 400.

The capacitor 400 is connected to the memory cell structure 200 and stores electric charges in response to gate and source signals. In this example, the capacitor 400 includes a metallic lower electrode 410 connected with the storage contact 320 and supported by at least a support 415, a dielectric layer 420 covering the lower electrode 410 and the support 415 and a metallic upper electrode 430 covering the dielectric layer 420. Thus, the capacitor 400 is a MIM capacitor in which the dielectric layer 420 is interposed between the metallic lower and the upper electrodes 410 and 430.

The capacitor 400 having the metallic lower and upper electrodes 410 and 430 and the dielectric layer 420 may have substantially the same structures and features as either of the capacitors 90 or 91 shown in and described with reference to FIGS. 1 and 2.

Thus, the lower and the upper electrodes 410 and 430 may comprise a metal material having a good conductivity. Examples of the conductive metal may include titanium nitride (TiN), titanium aluminum nitride (TiAlN), tantalum nitride (TaN), tungsten nitride (WN), ruthenium (Ru), ruthenium oxide (RuO2), iridium (Ir), iridium oxide (IrO2), and niobium nitride (NbN). These may be used alone or in combinations thereof. Furthermore, the dielectric layer 420 may include at least any one of zirconium oxide (ZrO2), hafnium oxide (HfO2), tantalum oxide (Ta2O3), aluminum oxide (Al2O3), aluminum nitride (AlN), boron nitride (BN), zirconium nitride (Zr3N4), hafnium nitride (Hf3N4), and a lanthanide, i.e., any of these dielectric materials alone or in combinations thereof.

The dielectric layer 420 may satisfy equation (1) above. That is, the second crystal size S2 of the dielectric layer 420 may be the crystal expansion ratio R times the first crystal size S1 of the lower electrode 410 and the crystal expansion ratio R may be determined by the process conditions of the heat treatment for forming the dielectric layer 420.

In the present example, the crystal expansion ratio R is in a range of 5 to 20. Thus, the second crystal size S2 may be 5 to 20 times the first crystal size S1. For example, when the lower electrode 910 is of titanium nitride (TiN) or niobium nitride (NbN) and the first crystal size S1 is in a range of about 3 nm to about 10 nm, the second crystal size S2 of the dielectric layer 420 is in a range of about 15 nm to about 200 nm.

It is generally known that the size difference of crystals between the lower electrode and the dielectric layer increases the dielectric constant of the dielectric layer in the MIM capacitor. Thus, the size increase of the crystals of the dielectric layer 420 with respect to the lower electrode 410 may sufficiently increase the dielectric constant of the dielectric layer 420, and as a result, may increase the capacitance of the capacitor 400.

Due to the high degree of integration of the recent semiconductor devices, the capacitor of the semiconductor device requires high capacitance for high performance while the capacitor area tends to be reduced in the semiconductor devices. For that reason, the dielectric constant of the dielectric layer 420 of the capacitor 400 need be increased for high capacitance. The dielectric constant of the dielectric layer 420 may easily and simply increase just by expanding or enlarging the crystal size of the dielectric layer 420 without any composition changes of dielectric layer 420. The crystal size of the dielectric layer 420 may be the crystal expansion ratio times the crystal size of the lower electrode 410 and the dielectric constant of the dielectric layer 420 may increase without any high dielectric materials.

Particularly, an equivalent oxide thickness of the dielectric layer need be reduced for a sufficient dielectric constant in the conventional capacitor. However, the small equivalent oxide thickness may deteriorate the leakage characteristics of the dielectric layer 420. However, the dielectric constant of the dielectric layer 420 may increase just by increasing the crystal size although the dielectric material may not be changed by high dielectric materials. Therefore, the dielectric constant of the dielectric layer 420 may be sufficiently improved without any deterioration of the leakage characteristics of the dielectric layer 420.

The smaller the crystal size of the lower electrode 410, the greater the crystal expansion ratio, and the greater the crystal expansion ratio, the larger the crystal size of the dielectric layer 420. Thus, the dielectric constant of the dielectric layer 420 may increase as the crystal size of the lower electrode 410 may be reduced.

The first metal of the lower electrode 410 may be selected in such a way that the crystal size may be minimized in the layer formation process for forming the lower electrode 410, so the lower electrode 410 may be formed to have the minimal crystal size. In contrast, the lower electrode 410 may be deformed in such a way that the crystallographic direction may be directed to the <111> direction and the preliminary dielectric layer 420a may have the same crystal size as the unit crystal of the lower electrode 410 in the <111> direction. Thus, the preliminary dielectric layer 420a may be formed into a minute crystal structure crystal from the unit crystal of the lower electrode 410 in the <111> direction without any crystal size reduction of the lower electrode 410.

The lower electrode 410, the dielectric layer 420 and the upper electrode 430 may have substantially the same configurations as the lower electrode 10, the dielectric layer 20 and the upper electrode 30 shown in FIGS. 1 and 2, and thus any detailed descriptions on the lower electrode 410, the dielectric layer 420 and the upper electrode 430 will be omitted.

Figure 6:
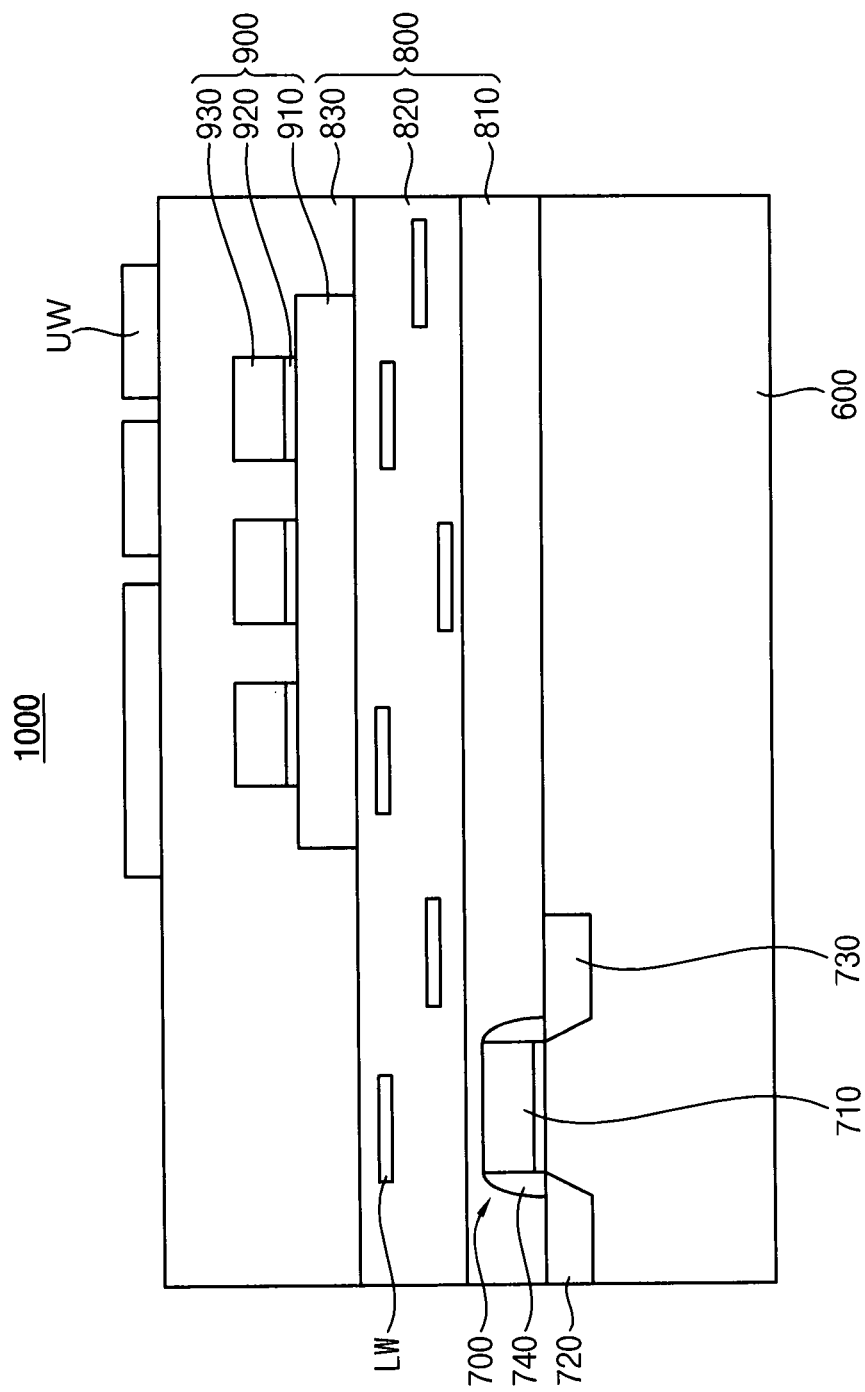
FIG. 6 is a cross-sectional view of another example of a semiconductor device having a capacitor in accordance with the present inventive concept.

FIG. 6 illustrates another example of a semiconductor device having a capacitor in accordance with the present inventive concept. In the example of FIG. 6, the semiconductor device is an analogue semiconductor device having a BEOL capacitor. The BEOL capacitor may have a structure and features similar either of the capacitors 90 or 91 shown in and described with reference to FIGS. 1 and 2.

Referring to FIG. 6, the example of a semiconductor device 1000 in accordance with the present inventive concept includes a substrate 600, a memory cell structure 700 at an upper portion of the substrate 600, a plurality of lower wirings LW vertically and horizontally separated in a lower insulation interlayer 820 and connected to the memory cell structure 700, a MIM capacitor 900 on the lower insulation interlayer 820, an upper insulation interlayer 830 covering the MIM capacitor 900 and a plurality of upper wirings UW connected to the MIM capacitor 900.

The substrate 600 may comprise a semiconductor substrate or a glass substrate of a flat panel display. A plurality of thin film transistors (TFT) may be arranged on the glass substrate. Examples of the semiconductor substrate include a silicon (Si) substrate, gallium-arsenide (Ge—As) substrate, a silicon-germanium (Si—Ge) substrate, a silicon-on-insulator (SOI) substrate and a germanium-on-insulator (GOI) substrate.

A gate structure 710 may be arranged on an active region of the substrate 600 and source and drain junctions 720 and 730 may be arranged at surface portions of the active region around both the gate structure 710. A gate spacer 740 may be arranged on both sides of the gate structure 710. The gate structure 710, the source and drain junctions 720 and 730 and the gate spacer 740 may constitute a single memory cell structure 700. Although the figure illustrates only one memory cell structure 700, the semiconductor device 1000 may have a plurality of the memory cell structures. The neighboring memory cell structures 700 may be electrically isolated from each other by a device isolation layer (not shown).

The signals may be stopped or amplified by the memory cell structure 700 according to the characteristics of the semiconductor device 1000. Thus, the number and layout of the memory cell structures 700 depends on the operational characteristics of the semiconductor device 1000.

The memory cell structure 700 may include at least one of a memory cell and a logic cell. The memory cell may include at least a DRAM cell and at least a flash memory cell. In particular, when the memory cell structure 700 includes a DRAM cell, a cell capacitor (not shown) may be provided with the memory cell structure 700 as a data storing unit. In the present example, the cell capacitor may have substantially the same structure and features as either of the capacitors 90 or 91 shown in and described with reference to FIGS. 1 and 2.

The memory cell structure 700 may be covered by the insulation interlayer 800 and at least an interconnector (not shown) and at least a wiring (not shown) may be connected to the memory cell structure 700 through the insulation interlayer 800. The memory cell structure 700 may be placed in electrical communication with other components via the interconnector and the wirings extending through the insulation interlayer 800.

The insulation interlayer 800 includes, for example, a planarization layer 810, the lower insulation interlayer 820 on the planarization layer 810 and the upper insulation interlayer 830 on the lower insulation interlayer 820. The lower insulation interlayer 820 may include a multilayered structure and a plurality of lower wirings LW may be arranged on each layer of the multilayered structure. Thus, the lower wirings LW may be electrically isolated from each other by the lower insulation interlayer 820. The MIM capacitor 900 may be arranged on the lower insulation interlayer 820 and may be covered by the upper insulation interlayer 830 in such a way that the MIM capacitor 900 is encapsulated.

The lower wirings LW may be connected to each other by a via (not shown) extending through the lower insulation interlayer 820 and the via may be connected to a contact plug (not shown) making contact with the source and drain junctions 720 and 730. Accordingly, the memory cell structure 700 is placed in electrical communication with other components via the lower wirings LW, the via and the contact plug.

The MIM capacitor 900 includes a metallic lower electrode 910 on the lower insulation interlayer 820, a dielectric layer 920 on the lower electrode 910 and a metallic upper electrode 930 on the dielectric layer 920. A resistor and an inductor as well as the MIM capacitor 900 may be arranged on at least one of the lower insulation interlayer 820 and the upper insulation interlayer 830 in the semiconductor device 1000. The resistor, the inductor and the MIM capacitor 900 may constitute a passive device of the semiconductor device 1000. A plurality of the MIM capacitors 900 may be laid out according to the operation characteristics and functions of the semiconductor device 1000.

In the present example, the lower electrode 910 has the form of a plurality of linear electrode straps that extend lengthwise, i.e., longitudinally, in a predetermined direction on the lower insulation interlayer 820. The dielectric layer 920 and the upper electrode 930 are stacked on the lower electrode 910 and a plurality of stack structures of the dielectric layer 920 and the upper electrode 930 may be spaced apart by uniform intervals along the electrode strap. Thus, the dielectric layer 920 and the upper electrode 930 may have the same width and uniform gaps may be present between the neighboring stack structures constituted by the dielectric layer 920 and the upper electrode 930 on the electrode strap. Accordingly, in this example, a plurality of the stack structure having the dielectric layer 920 and the upper electrode 930 are systematically arranged in a matrix on the electrode straps. That is, in this example, a plurality of the MIM capacitors 900 are arranged in a matrix on the lower insulation interlayer 820.

In the present example, the MIM capacitor 900 has substantially the same structure and features as either of the capacitors 90 or 91 shown in and described with reference to FIGS. 1 and 2.

Therefore, the lower and the upper electrodes 910 and 930 may comprise a metal material having a good conductivity. Examples of the conductive metal include titanium nitride (TiN), titanium aluminum nitride (TiAlN), tantalum nitride (TaN), tungsten nitride (WN), ruthenium (Ru), ruthenium oxide (RuO2), iridium (Ir), iridium oxide (IrO2), and niobium nitride (NbN). These may be used alone or in combinations thereof. Furthermore, the dielectric layer 920 may include at least any one of zirconium oxide (ZrO2), hafnium oxide (HfO2), tantalum oxide (Ta2O3), aluminum oxide (Al2O3), aluminum nitride (AlN), boron nitride (BN), zirconium nitride (Zr3N4), hafnium nitride (Hf3N4), and a lanthanide, i.e., any one of these dielectrics or combination thereof.

The dielectric layer 920 may satisfy equation (1) above. That is, the second crystal size S2 of the dielectric layer 920 is the crystal expansion ratio R times the first crystal size S1 of the lower electrode 910 and the crystal expansion ratio R may be determined by the process conditions of the heat treatment for forming the dielectric layer 920.

In the present example, the crystal expansion ratio R is in a range of 5 to 20. Thus, the second crystal size S2 is 5 to 20 times the first crystal size S1. For example, when the lower electrode 910 comprises titanium nitride (TiN) or niobium nitride (NbN) and the first crystal size S1 is in a range of about 3 nm to about 10 nm, the second crystal size S2 of the dielectric layer 420 is in a range of about 15 nm to about 200 nm.

It is generally known that the size difference of crystals between the lower electrode and the dielectric layer increases the dielectric constant of the dielectric layer in the MIM capacitor. Thus, the size increase of the crystals of the dielectric layer 920 with respect to the lower electrode 910 may sufficiently increase the dielectric constant of the dielectric layer 920, and as a result, may increase the capacitance of the MIM capacitor 900.

The metal for the lower electrode 910 may be selected in such a way that the crystal size may be minimized in the layer formation process for forming the lower electrode 910, so the lower electrode 910 may be formed to have the minimal crystal size. In contrast, the lower electrode 910 may be deformed in such a way that the crystallographic direction may be directed to the <111> direction and a preliminary dielectric layer may have the same crystal size as the unit crystal of the lower electrode 910 in the <111> direction. Thus, the preliminary dielectric layer may be formed into a minute crystal structure crystal from the unit crystal of the lower electrode 910 in the <111> direction without any crystal size reduction of the lower electrode 910.

The lower electrode 910, the dielectric layer 920 and the upper electrode 930 may have substantially the same structures as the lower electrode 10, the dielectric layer 20 and the upper electrode 30 shown in FIGS. 1 and 2, and thus any detailed descriptions on the lower electrode 910, the dielectric layer 920 and the upper electrode 930 will be omitted.

The MIM capacitor 900 may be connected to an external power source (not shown) in such a way that the upper electrode 930 and the lower electrode 910 may be connected to the upper wiring HW on the upper insulation interlayer 830. Thus, the MIM capacitor 900 may function as a passive device in the semiconductor device 1000.

Although not shown in figures, a resistor (not shown) and an external contact pad (not shown) may be arranged on the upper insulation interlayer 830. The resistor may function as a circuit element of the semiconductor device 1000 and may also function as a derivative resistor in the semiconductor device 1000. The derivative resistor may function in a characterized operation mode of the semiconductor device 1000. For example, when the semiconductor device 1000 is an analogue semiconductor device for controlling a digital device, the derivative resistor may be selectively activated when the operation mode of the digital device reaches the characterization operation state. The external contact pad contacts an external terminal such as a solder ball so that the external signals may be transferred to the semiconductor device 1000 via the external contact pad.

In a capacitor of the present inventive concept, the crystal size of the dielectric layer is greater than that of the lower electrode and the dielectric constant of the dielectric layer is relatively high as compared to a dielectric layer of the same material of the conventional capacitor. According to an aspect of the inventive concept, the dielectric constant of the dielectric layer is increased by changing the crystal size of the dielectric material not by selecting a different type of dielectric material having a higher dielectric constant. That is, capacitors according to the present inventive concept may be easily fabricated to have a relatively high capacitance.

In this respect, the smaller the crystal size of the lower electrode, the greater the crystal size of the dielectric layer becomes. Thus, the lower electrode may comprise such a metal material that the crystal size of the lower electrode will be as small as possible. Alternatively, the lower electrode may be formed in such a way that the crystallographic direction of the lower electrode is the <111> direction. In such a case, the crystal size of the preliminary dielectric layer may be sufficiently reduced regardless of the crystal size of the lower electrode.

Finally, examples of the inventive concept have been described above in detail. The inventive concept may, however, be put into practice in many different ways and should not be construed as being limited to the examples described above. Rather, these examples were described so that this disclosure is thorough and complete, and fully conveys the inventive concept to those skilled in the art. Thus, the true spirit and scope of the inventive concept is not limited by the examples described above but by the following claims.

What is claimed is:

1. A semiconductor device comprising:
a substrate; and
a plurality of memory cell structures arranged on the substrate and electrically connected to surroundings through a contact structure, a support, and a capacitor,
wherein the capacitor comprises
a lower electrode comprising a first metal material and having a crystal size of a few nanometers in such a configuration that the lower electrode is connected with the contact structure and supported by at least the support,
a dielectric layer comprising dielectric material covering the first metal material, the dielectric material comprising merged crystals that each include a plurality of crystals, the merged crystals having a crystal size that is a value of a crystal expansion ratio times the crystal size of the first metal material, wherein the crystal expansion ratio is an integer, and
an upper electrode covering the dielectric layer, the upper electrode comprising a second metal material and having a crystal size smaller than the crystal size of the dielectric material.

2. The semiconductor device of claim 1, wherein the first metal material of the lower electrode has a <111> crystallographic direction.

3. The semiconductor device of claim 1, wherein the lower electrode comprises at least one of titanium nitride (TiN) and niobium nitride (NbN).

4. The semiconductor device of claim 3, wherein the upper electrode comprises at least one of titanium nitride (TiN) and niobium nitride (NbN).

5. The semiconductor device of claim 1, wherein the integer is in a range of 5 to 20.

6. The semiconductor device of claim 5, wherein the crystal size of the first metal material is in a range of 3 nm to 10 nm and the crystal size of the dielectric layer is in a range of 15 nm to 200 nm.

7. A semiconductor device comprising:
a substrate; and
a plurality of memory cell structures arranged on the substrate and electrically connected to surroundings through a contact structure, a support, and a capacitor,
wherein the capacitor comprises
a lower electrode comprising a layer of metal material having a crystal size in a range of 3-10 nanometers,
a dielectric covering the layer of metal material of the lower electrode and comprising a layer of dielectric material, the dielectric material comprising merged crystals that each include a plurality of crystals, the merged crystals having a crystal size that is 5-20 times the crystal size of the layer of metal material of the lower electrode, and
an upper electrode covering the dielectric, the upper electrode comprising a layer of metal material having a crystal size smaller than the crystal size of the layer of dielectric material.

8. The semiconductor device of claim 7, wherein the layer of dielectric material is disposed directly on the layer of metal material of the lower electrode,
the layer of metal material of the lower electrode is a layer of titanium nitride (TiN) or a layer of niobium nitride (NbN), and
the layer of dielectric material is selected from the group consisting of zirconium oxide ($ZrO_2$), hafnium oxide ($HfO_2$), tantalum oxide ($Ta_2O_3$), aluminum oxide ($Al_2O_3$), aluminum nitride (AlN), boron nitride (BN), zirconium nitride ($Zr_3N_4$), hafnium nitride ($Hf_3N_4$), and lanthanides.

9. The capacitor semiconductor device of claim 7, wherein the layer of dielectric material is disposed directly on the layer of metal material of the lower electrode and the layer of metal material of the lower electrode has a <111> crystallographic direction.

10. The capacitor semiconductor device of claim 7, wherein the crystal size of the merged crystals is an integer number of times larger than the crystal size of the layer of metal material of the lower electrode.

11. The semiconductor device of claim 7, wherein the lower electrode comprises at least one layer of a metal material selected from the group consisting of titanium nitride (TiN), titanium aluminum nitride (TiAlN), tantalum nitride (TaN), tungsten nitride (WN), ruthenium (Ru), ruthenium oxide ($RuO_2$), iridium (Ir), iridium oxide ($IrO_2$), and niobium nitride (NbN).

12. The capacitor semiconductor device of claim 11, wherein the layer of dielectric material is a layer of material selected from the group consisting of zirconium oxide ($ZrO_2$), hafnium oxide ($HfO_2$), tantalum oxide ($Ta_2O_3$), aluminum oxide ($Al_2O_3$), aluminum nitride (AlN), boron nitride (BN), zirconium nitride ($Zr_3N_4$), hafnium nitride ($Hf_3N_4$), and a lanthanide.

13. A semiconductor device comprising:
a substrate;
a memory cell structure at an upper portion of the substrate;
a lower insulation interlayer on the substrate and covering the memory cell structure;
a plurality of lower wirings disposed in the lower insulation interlayer and electrically connected to the memory cell structure;
an upper insulation interlayer on the plurality of the lower wirings;
a plurality of upper wirings on the upper insulation interlayer; and
a capacitor disposed on the lower insulation interlayer and covered by the upper insulation interlayer in such a configuration that the capacitor is electrically connected to the upper wirings,
wherein the capacitor comprises
a lower electrode comprising a layer of a metal material,
a dielectric on the lower electrode and comprising a layer of dielectric material having a crystal size that is an integer multiple of a crystal size of the metal material of the lower electrode, and
an upper electrode disposed on the dielectric and comprising a layer of metal material having a crystal size smaller than the crystal size of the layer of dielectric material.

14. The semiconductor device of claim 13, wherein the crystal size of the layer of metal material of the lower electrode is in a range of 3-10 nanometers.

15. The semiconductor device of claim 13, wherein the crystal size of the layer of dielectric material is 5-20 times the crystal size of the metal material of the lower electrode.

16. The semiconductor device of claim 13, wherein the layer of metal material is a layer of titanium nitride (TiN) or niobium nitride (NbN).

17. The semiconductor device of claim 13, wherein the layer of metal material has a <111> crystallographic direction.

* * * * *